United States Patent [19]

Arinobu

[11] Patent Number: 4,914,385
[45] Date of Patent: Apr. 3, 1990

[54] CURRENT DETECTOR

[75] Inventor: Ichirou Arinobu, Fukuyama, Japan

[73] Assignee: Mitsubishi Denki Kabushiki Kaisha, Tokyo, Japan

[21] Appl. No.: 77,934

[22] Filed: Jul. 27, 1987

[51] Int. Cl.$^4$ ............... G01R 19/145; G01R 19/165
[52] U.S. Cl. .................. 324/127; 324/110; 336/234
[58] Field of Search ............... 361/93, 102; 340/650, 340/664; 324/127, 110, 74; 336/213, 234

[56] References Cited

U.S. PATENT DOCUMENTS

| | | | |
|---|---|---|---|
| 3,614,830 | 10/1971 | Bate et al. | 336/234 |
| 3,748,618 | 7/1973 | Kaiserswerth et al. | 336/212 |
| 4,079,430 | 3/1978 | Fujishima et al. | 336/234 |
| 4,106,095 | 8/1978 | Yarbrough . | |
| 4,163,938 | 8/1979 | Moore | 324/74 |
| 4,200,836 | 4/1980 | Okada et al. | 340/650 |
| 4,200,933 | 4/1980 | Nickel et al. | 324/74 |
| 4,283,677 | 8/1981 | Niwa | 336/176 |
| 4,325,096 | 4/1982 | Sunohara . | |
| 4,352,138 | 9/1982 | Gilker | 361/93 |
| 4,378,523 | 3/1983 | Norman | 324/74 |
| 4,410,848 | 10/1983 | Frierdich | 324/127 |
| 4,454,557 | 6/1984 | Hurley . | |
| 4,482,862 | 11/1984 | Leehey | 324/127 |
| 4,668,931 | 5/1987 | Bolnitz | 336/234 |

FOREIGN PATENT DOCUMENTS

| | | | |
|---|---|---|---|
| 0231589 | 3/1944 | Fed. Rep. of Germany | 336/234 |
| 2027522 | 10/1970 | France | 336/212 |
| 60-173814 | 9/1985 | Japan . | |
| 61-39512 | 2/1986 | Japan . | |
| 845706 | 3/1985 | South Africa . | |

*Primary Examiner*—Reinhard J. Eisenzopf
*Assistant Examiner*—W. Burns
*Attorney, Agent, or Firm*—Lowe, Price, LeBlanc, Becker & Shur

[57] ABSTRACT

A current detector comprises a primary current transformer (21) having a core made of silicon steel sheets and permalloy sheets overlapping each other, together with secondary current transformers (22) and (23) having cores made, respectively, of silicon steel and permalloy sheets. As a result, the detector exhibits linear current transformation throughout any current range, so that current detection errors are minimized.

13 Claims, 3 Drawing Sheets

CURRENT DETECTOR

FIELD OF THE INVENTION AND RELATED ART STATEMENT

1. Field of the Invention

The present invention relates to a current detector, and more particularly to a current detector which is applicable to protection and metering for AC power lines.

2. Description of the Related Art

A typical one-line circuit block diagram of the conventional protection and metering circuit comprising an assembly of the well known apparatuses is shown in FIG. 3. The following description will be mentioned for one line of three phase AC power lines. In the figure, a circuit breaker 1000 is for protecting a power line 10 and a load (e.g. a motor) 5000 from an excessive fault current which flows through the power line 10, and comprises a power source side terminal 1, a load side terminal 3, a main contact 2, a current transformer 21 for detecting the fault current through the power line 10, an overcurrent detecting device 1001 for detecting secondary current of the current transformer 21, a time delay circuit 1005 which operates with a time lag responding to an output level of the over current detecting device 1001 and a tripping unit 1003 which opens the main contact 2 responding to an output signal of the time delay circuit 1005.

A current transformer 24 and a voltage line 25 are provided for metering electric quantities in the power line 10. Secondary circuit of the current transformer 24 are connected to well known transducer 2000 comprising a metering circuit 2001 and an output circuit 2002. The metering circuit 2001 issues several metering signals responding to a secondary current of the current transformer former 24 and a voltage applied by the voltage line 25, and the output circuit 2002 issues an electric signal, for instance 0–5 volt or 4–20 miliamperes, by converting the metering signals. These electric signals can be used in a displaying unit 3000 and an output unit 4000 which is provided for monitoring, so that data of electric quantities of the power line are stored, displayed and monitored.

However, the above-mentioned conventional protection and metering circuit has the following shortcomings. The circuit breaker 1000 requires separate metering means, for instance the transducers 2000 for metering, and thereby a switchboard which equips the circuit breaker 1000 and the metering means becomes complicated and needs high cost to make.

furthermore, a transformer characteristic of the current transformer 21 for detecting an excessive fault current is required to be linear at an excessive primary current range which corresponds to currents which is larger than a rated current $I_N$ shown in FIG. 2, in order to trip the circuit breaker with a suitable time lag. On the other hand, the transformer characteristic of the current transformer 24 for metering of the power line 10 is required to be linear at a steady-state primary current range for accurate metering. Thereby, two current transformers which have different transformer characteristics are required for detecting the fault current and the steady-state current, respectively.

Furthermore, since the circuit breaker 1000 and the transducer 2000 are disposed separately, it is impossible to detect an internal fault of the circuit breaker 1000 by the transducer 2000. Therefore, even if some fault of the circuit breaker 1000 occurs, for instance being in such state that the circuit breaker 1000 cannot protect the electric line 10 or the load 5000, nobody will acknowledge such dangerous state.

OBJECT AND SUMMARY OF THE INVENTION

The object of the present invention is to provide a current detector capable of detecting an overcurrent and steady-state current for protection and metering with minimum detecting error, respectively, and miniaturizing a switchboard and having low cost and safety.

In order to achieve the above-mentioned object, the current detector in accordance with the present invention comprises:

first current sensor means provided for respective phases of AC power lines, wherein a core of the first current sensor means is made of at least two different materials of silicon steel sheets and permalloy sheets, and second and third current sensor means provided in series for respective outputs of the first current sensor, wherein cores of the second and third current sensor means are made of at least the silicon steel sheets and permalloy sheets, respectively.

the above-mentioned current detector has the following technical advantage.

Both detection errors of the overcurrent range and the steady-state current range are small, since the different type iron cores of the secondary current transformers assures the linearity of current transformation in the different current ranges.

DESCRIPTION OF THE PREFERRED EMBODIMENT

Figure 1:
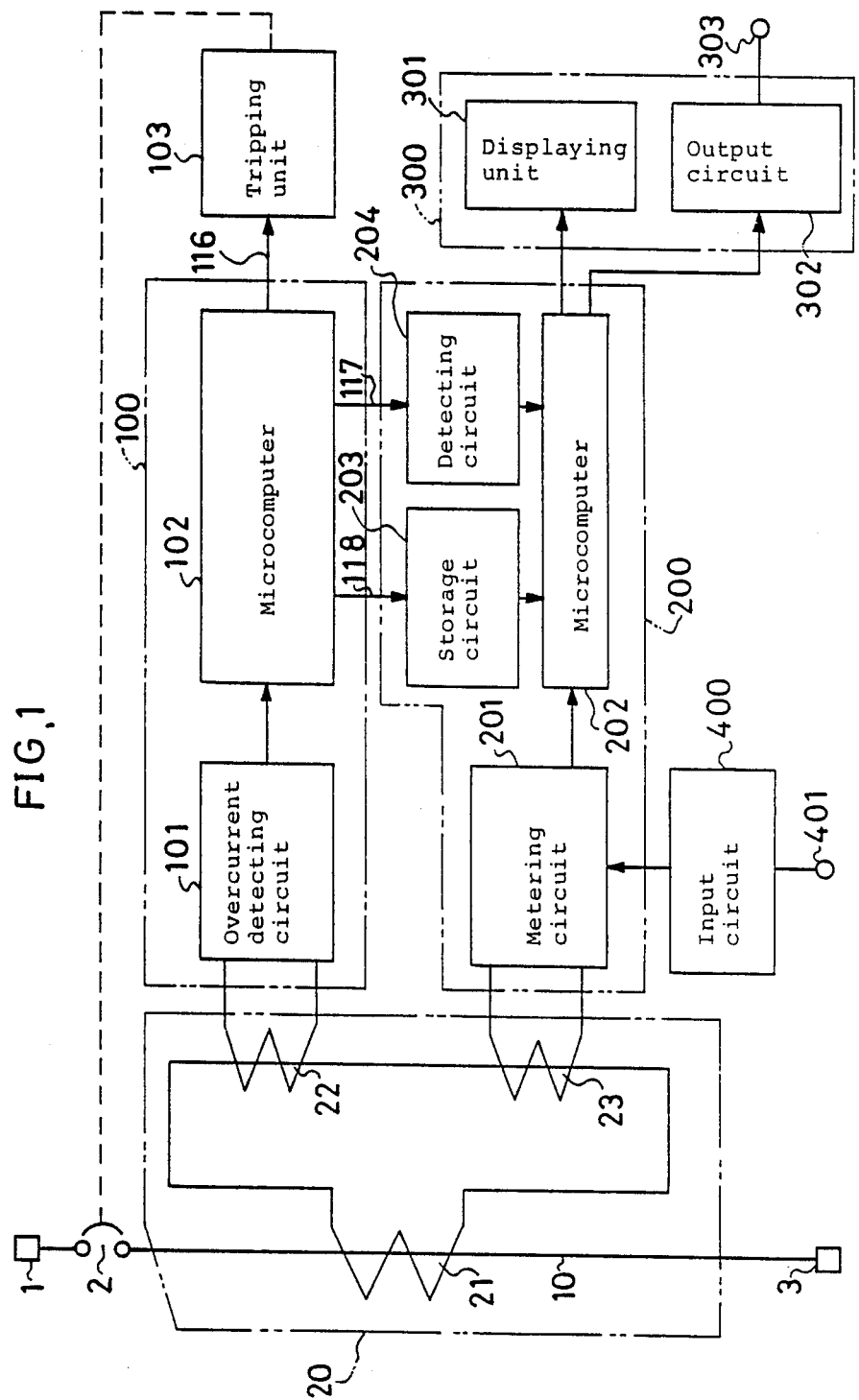
FIG. 1 is a block diagram showing an embodiment of a circuit breaker containing a current detector in accordance with the present invention.

Hereafter, preferred embodiments of the present invention is described with reference to the accompanying drawings. FIG. 1 shows an one-line circuit block diagram showing a circuit breaker containing a current detector of the present invention. A power source side terminal 1 and a load side terminal 2 are provided for connection with a power source and a load, respectively. A main contact 2 is connected to the power source side terminal 1 and the load side terminal 3, and primary side of a current transformer 21 is disposed across a power line 10 between the main contact 2 and the secondary terminal 3. Primary side of secondary current transformers 22 and 23 are connected in series across a secondary circuit of the current transformer 21 for detecting overcurrent and metering, respectively. And current detecting unit 20 comprises the above-mentioned current transformer 21 and secondary current transformers 22 and 23. Secondary terminals of the secondary current transformer 22 are connected to an overcurrent detecting circuit 101, and output terminals of the overcurrent detecting circuit 101 are connected to a microcomputer 102. An output signal 116 of the microcomputer 102 is connected to a tripping unit 103 which opens the main contact 2, hence to open the circuit breaker. Output signals 117 of the microcomputer is connected to a detecting circuit 204 which detects an internal fault of the microcomputer 102. Output signals 118 of the microcomputer are connected to a storage circuit 203 in order to issue an operation factor signal when the circuit breaker is tripped.

Secondary winding of the secondary current transformer 23 is connected to the metering circuit 201 which issues metering data, and an input circuit 400 having an input terminal 401 which receives other necessary metering quantities is connected to the metering circuit 201. The metering circuit 201 and the storage circuit 203 and the detecting circuit 204 are connected to a microcomputer 202 so as to give the metering data, the operating factor data and the internal fault signal of the microcomputer 102, respectively. Outputs of the microcomputer 202 are connected to a displaying unit 301 and an output circuit 302 which has an output terminal 303, so as to display the metering data and output the operating factor data and the internal fault signal of the microcomputer 102 and give these data for external use of the circuit breaker, respectively. A control (protection) unit 100 comprises the overcurrent detecting circuit 101 and the microcomputer 102, and a metering unit 200 comprises the metering circuit 201, the microcomputer 202, storage circuit 203 and the detecting circuit 204. Since the metering unit 200 is included into the circuit breaker, an installation space of the circuit breaker is made small and the switchboard having the circuit breaker therein can be miniaturized.

In the above-mentioned circuit breaker, when a fault current flows through the power line 10, the secondary winding of the current transformer 21 induces a secondary current in accordance with a ratio of current transformation, and thereby a primary current is supplied to the secondary current transformers 22 and 23. Further, the secondary windings of the secondary current transformers 22 and 23 induce secondary currents in accordance with the ratio of current transformations, respectively.

Since the secondary current transformer 23 is to issue output current to the metering circuit 201 for metering several electric quantities, sufficient linearity of current transformation is required at a steady-state current range. On the other hand, the secondary current transfomer 22 requires substantial linearity of current transformation at an excessive fault current range. In other words, the secondary current transformer 22 for detecting overcurrent does not require the linearity of current transformation at a range which is below an allowable current of the power line 10, and the secondary current transformer 23 for metering does not require the linearity of current transformation at the excessive fault current range since such excessive current which brings magnetic saturation is out of metering range.

Therefore, an iron core of the current transformer 21 consists of permalloy-family sheet iron core and silicon-family steel sheet iron core with each other overlapped configuration so as to have two types of transformer characteristic for the secondary current transformers 22 and 23, respectively. The current transormer 21 is generally known window type wherein the power line is disposed in a window thereof. For instance, when the current of 1000 ampere flows through the power line 10, the current of 5 ampere flows through the secondary winding of the current transformer 21. That is, the ratio of current transformation is 1000:5.

The secondary current transformer 22 is a generally known core-type (EI core is generally used), which is composed of the silicon-family steel sheet. When the secondary current of the current transformer 21, for instance of 5 ampere, flows through a primary side of the secondary current transformer 22, the current of 1000 miliampere flows through the secondary winding of the secondary current transformer 22 and the overcurrent detecting circuit 101. That is, the ratio of current transformation is 5:0.1. The secondary current transformer 23 is a generally known toroidal type, which is composed of tape-shaped permalloy-family iron core. When the secondary current of the current transformer 21, for instance of 5 ampere, flows through a primary side of the secondary currnt transformer 23, the current of 50 miliampere flows through the secondary winding of the secondary current transformer 23 and the metering circuit 201. That is, the ratio of current transformation is 5:0.05. The iron core of the silicon-family steel sheet has a low permeability, and thereby it requires relatively high exciting current. Therefore, a linearity of the current transformation becomes worse in a low current range, on the other hand, it becomes better in a high current range. On the contrary, the iron core of the permalloy-family has a high initial permeability, and thereby the linearity of the current transformation becomes better in the low current range. Therefore, a combination of the current transformer 21 and the secondary current transformer 22 has better linearity in the large current range, namely the range of fault current, and a combination of the current transformer 21 and the secondary current transformer 23 has better linearity in the low current range, namely the range of steady-state current.

Figure 2:
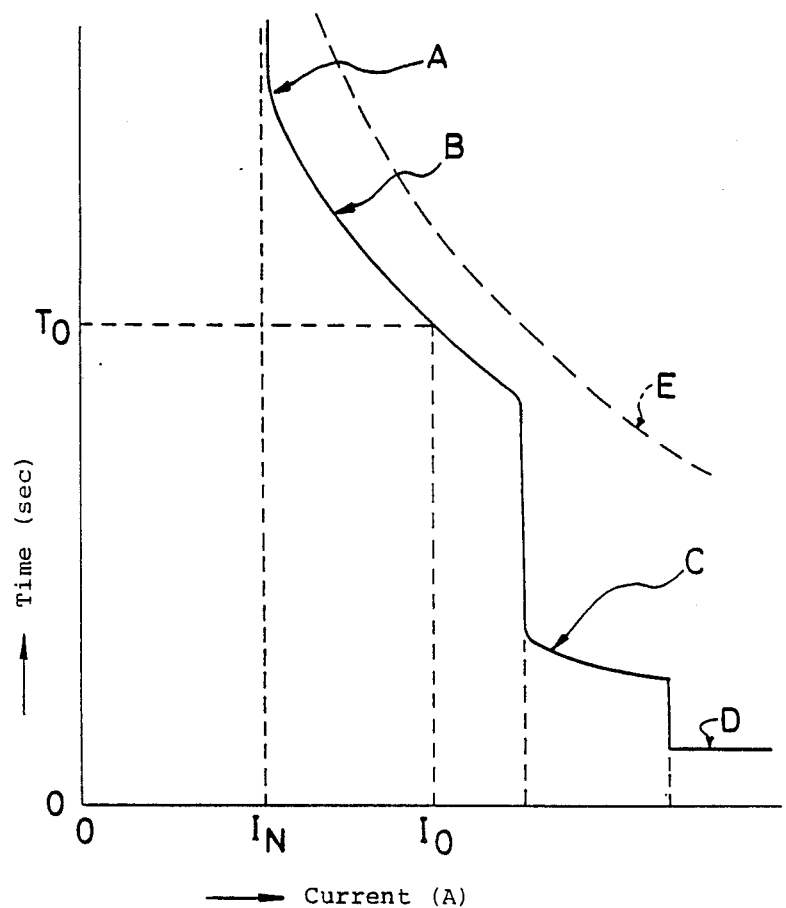
FIG. 2 is a graph showing time-current operation curve which is generally required for a circuit breaker.
Figure 3:
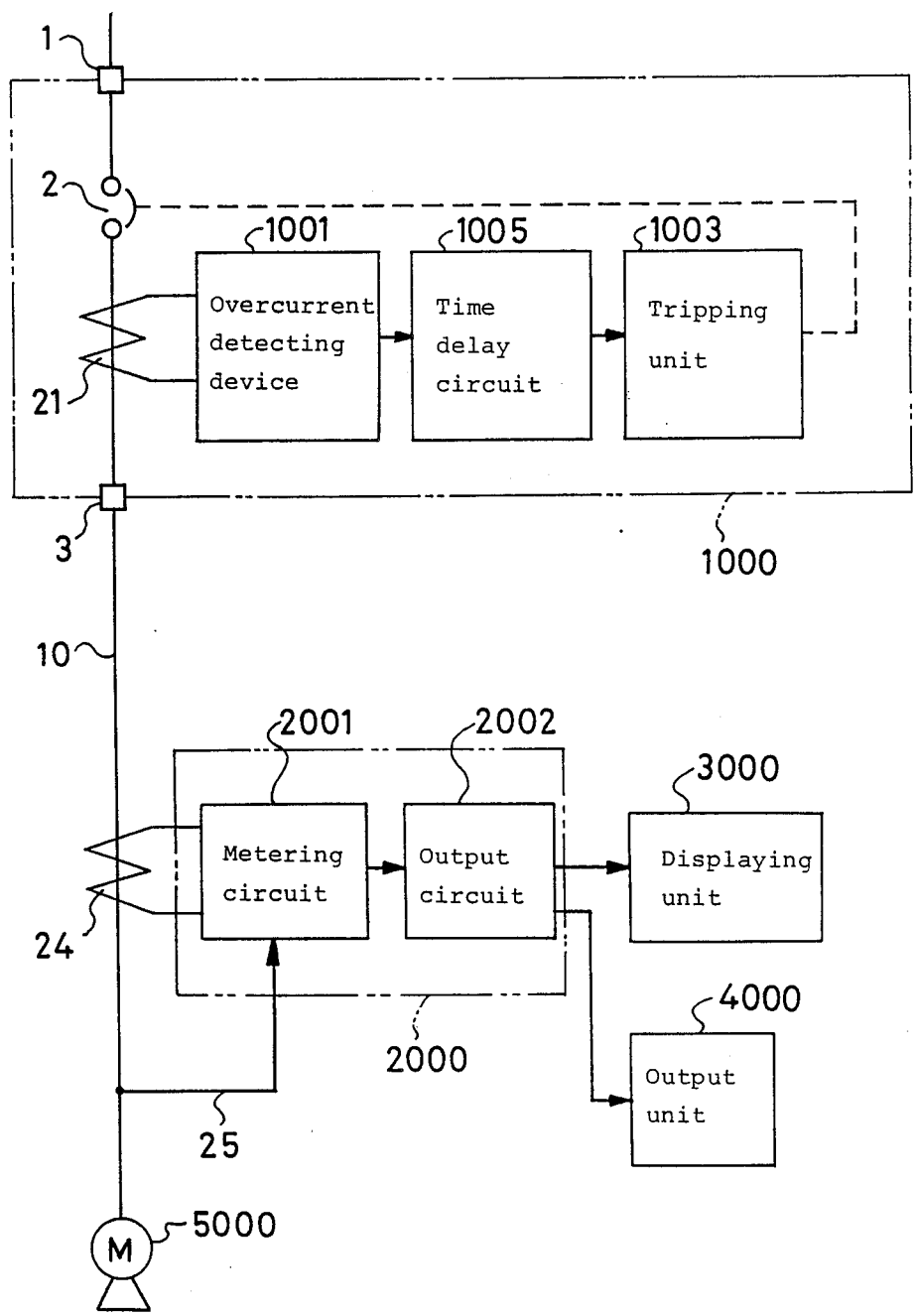
FIG. 3 is the block diagram showing the conventional circuit breaker and the metering means.

The overcurrent detecting circuit 101 detects secondary output currents of the secondary current transformer 22, and issue their detected data to the microcomputer 102 as input data. The microcomputer 102 operates responding to the input data with such a time delay which is determined by the time-current operation curve "A" shown in FIG. 2. For instance, if the input data which corresponds to the fault current $I_o$ remains during a predetermined time $T_o$ as shown in FIG. 2, the microcomputer 102 issues an output signal 116 to the tripping unit 103 and an operation facter data which determines a relation of $I_o$ and $T_o$, namely B of FIG. 2, to the storage circuit 203 so as to store the operation factor. At the same time, the tripping unit 103 opens the main contact 2, thereby to interrupt the fault current flowing through the power line 10. The operation factors B, C and D of FIG. 2 are of "inverse long-time operation", "inverse short-time operation" and "instantaneous operation", respectively. These operation curves are in a range of shorter time than the time shown by a dotted line curve E showing a heat capacity of the power line 10 in order to protect the power line 10.

The secondary output of the secondary current transformer 23 is given to the metering circuit 201, and other metering data, for instance voltage data, are given to the metering circuit via the input circuit 400 from the input terminal 401. The metering circuit 201 issues the metering data by predetermined metering means to the microcomputer 202. The microcomputer 202 receives the metering data of the metering circuit 201 and operates them by predetermined procedures, and issues the control signal so as to control the displaying unit 301 and the output circuit 302. Further, the microcomputer 202 receives the operation factor data which is given from a control unit 100 and is stored in the storage circuit 203. Furthermore, the microcomputer 202 receives an output data of the detecting circuit 204 which detects the internal fault of the microcomputer 102, thereby to monitor whether the microcomputer 102 is healthy or not and improve safty. And then, the microcomputer 202 issues the output signal to the displaying unit 301 and the output circuit 302 after predetermined operational procedure. The displaying unit 301 displays the metering data, operation factor data and the internal fault data, and the output circuit 302 issues an output signal from the output terminal 303 to the external use of the circuit breaker.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

What is claimed is:

1. A current detector comprising:
   first current sensor means provided for respective phases of AC power lines, wherein said first current sensor means includes a closed loop electromagnetically coupled to said line and has a core made of at least two different materials of silicon steel sheets and permalloy sheets, respectively;
   second current sensor means electromagnetically coupled to an output of said first sensor means and having a core formed of silicon steel sheets exclusive of permalloy sheets;
   third current sensor means electromagnetically coupled to said output of said first sensor means and having a core formed of permalloy sheets exclusive of silicon steel sheets;
   control means for generating a time-current operating signal in response to an output of said second current sensor means; and
   metering means for generating an electric quantity signal in response to an output of said third current sensor means.

2. A current detector in accordance with claim 1, wherein
   said metering means detects a fault of said control means and issues a fault signal.

3. A current detector in accordance with claims 1, further comprising:
   input means for receiving at least voltage signals of said AC power lines.

4. A current detector as recited in claim 1, wherein said second and third current sensor means are connected in series with one another.

5. A current detector, comprising:
   first current sensor means provided for respective phases of AC power lines, wherein a core of said first current sensor means is made of at least two different materials of silicon steel sheets and permalloy sheets;
   second and third current sensor means provided in series for respective outputs of said first current sensor means, wherein cores of said second and third current sensor means are made of at least said silicon steel sheets and said permalloy sheets, respectively;

control means for issuing a time-current operating signal in response to a secondary output of said second current sensor means; and
   metering means for issuing electric quantity signals in response to a secondary output of said third current sensor means;
   said control means generating an operation factor signal in response to said time-current operating signal to said metering means, and said metering means issuing said operation factor signal.

6. A current detector in accordance with claim 5, wherein
   said metering means has a storage means for storing said operation factor signal.

7. A current detector in accordance with claim 6, wherein
   said metering means further has a microcomputer.

8. A current detector in accordance with claims 4, further comprising:
   output means for outputting said electric quantity signals.

9. A current detector in accordance with claim 8, wherein
   said output means has at least display means.

10. A current detector comprising:
    first current sensor means provided for respective phases of AC power liens, wherein said first current sensor means includes a closed loop electromagnetically coupled to said line and has a core made of at least two different materials of silicon steel sheets and permalloy sheets, respectively;
    second current sensor means electromagnetically coupled to an output of said first sensor means and having a core formed of silicon steel sheets; and
    third current sensor means in series with said second current sensor means electromagnetically coupled to said output of said first sensor means and having a core formed of permalloy sheets,
    wherein said second current sensor means has a core formed of silicon steel exclusive of permalloy sheets and said third current sensor means has a core formed of permalloy sheets exclusive of silicon steel sheets.

11. A current detector comprising:
    first current sensor means provided for each of a plurality of respective phases of AC power lines, wherein said first current sensor means includes a first current transformer having a primary winding and a secondary winding connected to form a closed current loop , said first current sensor having a core made of at least two different materials of silicon steel sheets and permalloy sheets, respectively;
    second current sensor means electromagnetically coupled to a secondary circuit including said secondary winding of said first current sensor means and having a core formed of silicon steel sheets; and
    third current sensor means electromagnetically coupled to said secondary circuit and having a core formed of permalloy sheets.

12. A current detector as recited in claim 11 wherein said second and third current sensors comprise second and third current transformers, respectively, having respective second and third primary windings.

13. A current detector as recited in claim 12 wherein said second and third primary windings of said second and third current sensors are connected in series across said secondary winding of said first current transformer.

* * * * *